(12) United States Patent  
Todd et al.

(10) Patent No.: US 9,426,921 B2  
(45) Date of Patent: Aug. 23, 2016

(54) MULTI-INTERFACE

(75) Inventors: Timothy Todd, Bristol (GB); Thorsten Nitsche, Hamburg (DE)

(73) Assignees: AIRBUS OPERATIONS LIMITED, Bristol (GB); AIRBUS OPERATIONS GMBH, Hamburg (DE)

( * ) Notice: Subject to any disclaimer, the term of this patent is extended or adjusted under 35 U.S.C. 154(b) by 222 days.

(21) Appl. No.: 13/821,705

(22) PCT Filed: Sep. 8, 2011

(86) PCT No.: PCT/EP2011/065582  
§ 371 (c)(1),  
(2), (4) Date: Mar. 8, 2013

(87) PCT Pub. No.: WO2012/038267  
PCT Pub. Date: Mar. 29, 2012

(65) Prior Publication Data  
US 2013/0171852 A1 Jul. 4, 2013

(30) Foreign Application Priority Data  
Sep. 21, 2010 (GB) .................. 1015761.8

(51) Int. Cl.  
*H05K 7/00* (2006.01)  
*H05K 5/00* (2006.01)  
*H05K 7/14* (2006.01)

(52) U.S. Cl.  
CPC ............ *H05K 7/1412* (2013.01); *H05K 7/1457* (2013.01)

(58) Field of Classification Search  
CPC .............................. H01R 25/003; H01R 27/02  
USPC ....................................................... 361/679.01  
See application file for complete search history.

(56) References Cited

U.S. PATENT DOCUMENTS

| 8,391,788 | B1 * | 3/2013 | Mazuk et al. | ................ 455/41.2 |
| 2002/0013087 | A1 * | 1/2002 | Doriski, Jr. | ................... 439/502 |
| 2005/0047065 | A1 | 3/2005 | Cooper et al. | |
| 2005/0124211 | A1 | 6/2005 | Diessner et al. | |

FOREIGN PATENT DOCUMENTS

WO 2011017233 A1 2/2011

OTHER PUBLICATIONS

XP-002665983—Innovative Technology Reduces Wiring and Harness Test Time.  
Search Report issued in Application No. GB1015761.8 on Sep. 8, 2011.

* cited by examiner

*Primary Examiner* — Jerry Wu  
(74) *Attorney, Agent, or Firm* — Haupman Ham, LLP

(57) ABSTRACT

A line replaceable unit (LRU) for an integrated modular avionics (IMA) architecture, the LRU comprising at least one input/output interface and a plurality of connectors, wherein each connector includes at least one pin and each connector is adapted for connection to a single segregated wire route bundle, and wherein hardware of one interface is electrically connected within the LRU to one or more pins of each of at least two of the connectors. Also, an IMA architecture including the LRU, and an aircraft including the LRU or the IMA architecture.

15 Claims, 5 Drawing Sheets

MULTI-INTERFACE

RELATED APPLICATIONS

The present application is a National Phase of PCT/EP2011/065582, filed Sep. 8, 2011, and is based on, and claims priority from, Great Britain Application No. 1015761.8, filed Sep. 21, 2010.

FIELD OF THE INVENTION

The present invention relates to a line replaceable unit (LRU) for an integrated modular avionics (IMA) architecture. Also, an IMA architecture including the LRU, and an aircraft including the LRU or the IMA architecture.

BACKGROUND OF THE INVENTION

Modern aircraft typically include a great number of sensors, effectors (e.g. actuators), etc., connected to an avionics network having one or more central processors in an avionics bay. The sensors, effectors, etc. are typically concentrated at particular locations in the aircraft where systems are installed. To reduce wiring, and therefore weight, a remote data concentrator (RDC) may be used to connect several of the sensors, effectors, etc. to the central processors via data buses.

RDCs and avionics bay units are examples of LRUs commonly found in avionics architectures. To reduce design and manufacturing costs, and to improve operational effectiveness, the LRUs may be standardised. For example, the RDCs on a particular aircraft may have common hardware, regardless of the sensors, effectors, etc. to which they are connected, and so are known as common remote data concentrators (cRDCs). The cRDCs may include configurable software. Standardisation of the LRUs makes it possible to hold an inventory of fewer parts, such that a defective LRU can be readily replaced during routine maintenance tasks, thereby improving operational effectiveness.

Each wire route within an avionics architecture may carry a route designation, and route segregation rules are typically applied to architecture design. The route designation may be, for example, a side of an aircraft and/or a level of "essentiality". Wire routes are typically bundled on either side of the aircraft (side 1 or side 2) such that a single side failure does not affect the other. The essentiality is a measure of criticality and reliability within the avionics architecture. The wire route segregation rules may, for example, call for segregation of wire routes on either side of the aircraft and/or of wire routes of different essentiality. The wire route segregation rules may call for segregation up to and including the connectors, which connect the wire routes to the LRUs.

Whilst the provision of common LRUs within the avionics architecture provides several advantages as mentioned above, the number of wire routes of a particular route designation can be variable across the aircraft. This, together with wire route segregation rules makes it difficult to introduce a common LRU design without providing the LRU with a larger number of interface hardware than there are wire routes to be connected at most locations. Unused interface hardware has an associated component cost, space and weight penalty, which is undesirable as it reduces operational efficiency, e.g. increased fuel burn.

One existing solution for reducing the amount of unused hardware in commonly designed LRUs calls for an integration panel between the connectors and the LRU. The integration panel carries a short length of mixed wire route bundles so as to increase the number of instances where most of the LRU interface hardware is in use. This solution is used commonly on avionics bay LRUs. However, the integration panel carries a weight and space penalty.

Another existing solution is to provide the commonly designed LRUs with a reduced number of hardware interfaces, and to increase the number of LRUs at specific locations where the number of hardware interfaces available is insufficient, rather than provide bespoke designed units at those use intensive locations. Duplication of LRUs carries a weight and space penalty.

SUMMARY OF THE INVENTION

A first aspect of the invention provides a line replaceable unit (LRU) for an integrated modular avionics architecture, the LRU comprising at least one input/output interface and a plurality of connectors, wherein each connector includes at least one pin and each connector is adapted for connection to a single segregated wire route bundle, and wherein hardware of one interface is electrically connected within the LRU to one or more pins of each of at least two of the connectors.

The invention is advantageous in that the interface hardware is selectively available on multiple connectors. This type of interface has been termed a "multi-interface". In this way, the number of interface hardware is reduced by one for every instance that one interface hardware is connected to a pin or pins of a different connector. If an available pin of a first connector is unusable for a particular route designation, because other pins of that connector have already been assigned a different route designation, but a pin of a second connector of the correct route designation is also available and connected to the same interface hardware, then the hardware can be connected using the pin of the second connector. The number of interface hardware in each LRU can therefore be more closely matched to requirements, with greater flexibility in terms of which route designations can use interface hardware having connections to a pin or pins of multiple connectors. The invention also simplifies harnessing by reducing the amount of mixed routes, where these are necessary.

Each pin may be electrically connected to no more than one interface hardware within the LRU.

At least some of the connectors may include a plurality of pins. Increasing the number of pins per connector increases the number of wire routes having a given route designation that can be connected to the LRU.

One interface hardware may be electrically connected to a plurality of pins of one connector. In this example, the interface is a, so called, multi-pin interface.

One interface hardware may be electrically connected to a plurality of pins of each of at least two of the connectors. In this example, the multi-pin interface is selectively available on multiple connectors to form a multi-pin multi-interface.

The LRU may include a plurality of input/output interfaces, each electrically connected to at least one pin. Increasing the number of I/O interfaces per LRU increases the number of devices that can be connected to the LRU.

The LRU may be a remote data concentrator (RDC), or an avionics bay unit, for example.

According to a further aspect of the invention, there is provided an integrated modular avionics (IMA) architecture including at least one LRU according to the invention.

Individual connectors of the or each LRU may be connected to no more than one segregated wire route bundle, and the wire route segregation may be maintained up to and including the connectors. This arrangement may be used to satisfy route segregation rules applied to the avionics architecture design.

At least one LRU may have a plurality of connectors each connected to the same wire route bundle. Within a given architecture, it is possible that a particular route designation may be predominant, which other route designations are less common. The predominant route designation may therefore be found at a plurality of the connectors, whilst less common route designations may be found on only one, or on none, of the connectors of a particular LRU.

The IMA architecture may include a plurality of the LRUs each having identical hardware. Providing a common LRU design throughout, or through a major part of, an avionics architecture can provide significant design, manufacture and in-service cost savings.

Corresponding connectors of two of the LRUs may be either connected to dissimilar segregated wire route bundles, or only one of the connectors may be connected to a wire route bundle. Alternatively, the corresponding connectors of two of the LRUs may be connected to similar wire route bundles.

Each wire route may be designated according to a side of an aircraft and/or an essentiality selected from the group including (but not limited to): essential, sensitive, non-essential, and non-essential sensitive.

According to a further aspect of the invention, there is provided an aircraft including the LRU, or the IMA architecture, according to the invention.

BRIEF DESCRIPTION OF THE DRAWINGS

Embodiments of the invention will now be described with reference to the accompanying drawings, in which:

FIG. 6 illustrates schematically a simplified RDC according to a third embodiment having a single I/O interface including hardware connected to a respective pin of three different connectors;

FIG. 7 illustrates schematically a simplified RDC according to a fourth embodiment having a single I/O interface including hardware connected to a plurality of respective pins of two different connectors; and FIG. 8 illustrates a connector face of an exemplary RDC having eight connectors, each having at least one pin.

DETAILED DESCRIPTION OF EMBODIMENT(S)

Figure 1:
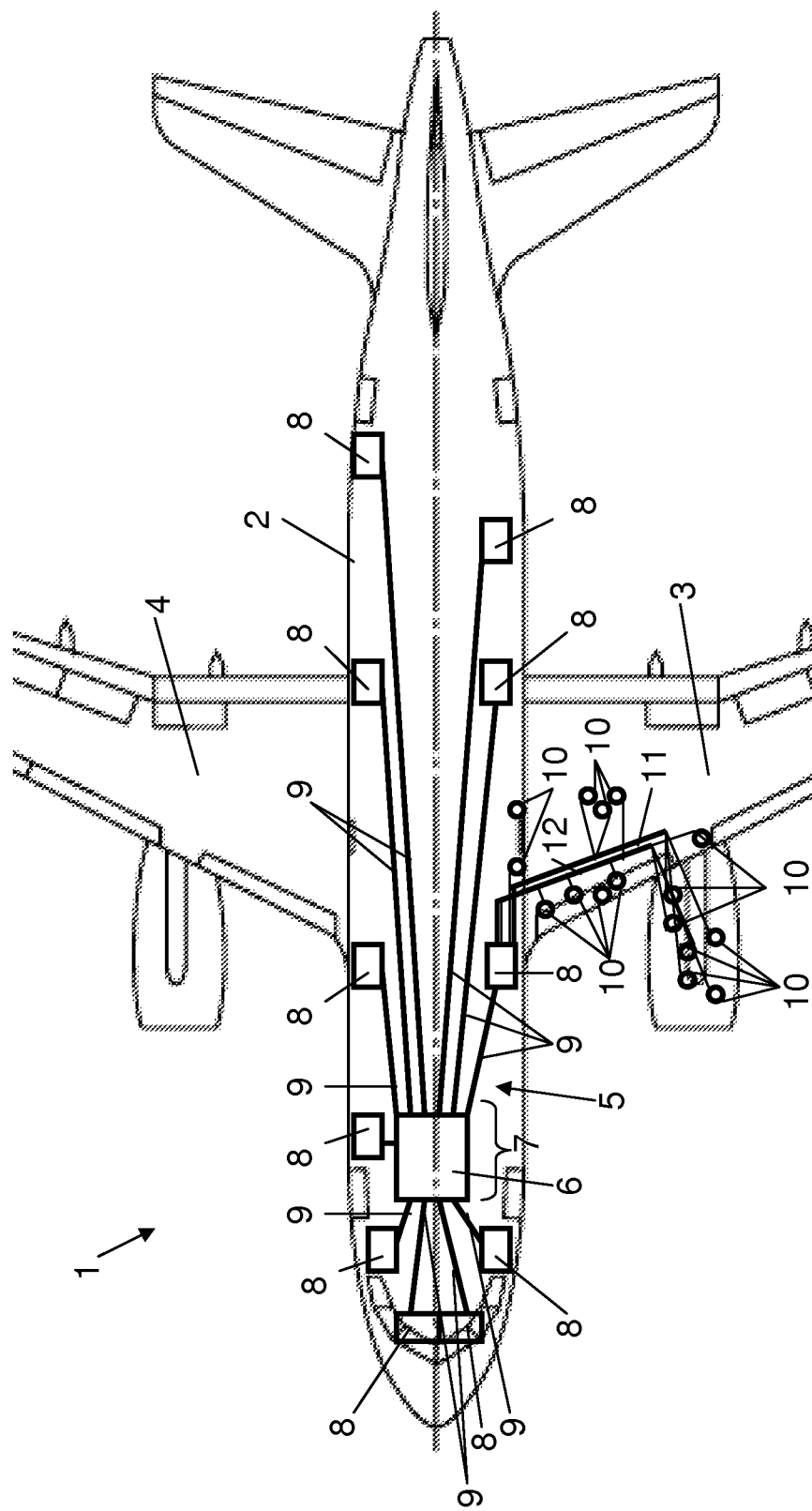
FIG. 1 illustrates schematically an avionics architecture installed in an aircraft, showing one of the RDCs connected to a plurality of sensors/effectors.

FIG. 1 illustrates schematically a plan view of an aircraft 1 having a fuselage 2, wings 3, 4, and an integrated modular avionics architecture 5. Avionics architecture 5 includes a core processor 6 comprising a plurality of line replaceable units (LRUs) in avionics bay 7. The core processor 6 is connected to a plurality of common remote data concentrators (cRDCs) 8 disposed at various locations around the aircraft 1. The cRDCs 8 are also examples of LRUs. The location and grouping of the cRDCs 8 is dependent upon the location of various sensors, effectors, etc. that need to be connected within the avionics architecture 5. The cRDCs 8 are connected via data buses 9 to the core processor 6.

For clarity, only one of the cRDCs 8 (located on the left fuselage side, forward of the wing box) is shown having connections to various sensors, effectors, etc. 10. A first wire route bundle 11 has a wire route designation "1M", which refers to side one of the aircraft, "essential" route. The first wire route bundle 11 connects cRDC 8 to the sensors, effectors, etc. 10 having the same wire route designation "1M". A second wire route bundle 12 has a designation "11M" referring to side one of the aircraft, "non-essential" route. The second wire route bundle 12 connects the cRDC 8 to the sensors, effectors, etc. 10 having the same wire route designation "11M".

All of the cRDCs 8 shown in FIG. 1 are connected similarly to various sensors, effectors around the aircraft by wire routes designated according to the side of the aircraft (i.e. side one or side two) and their level of essentiality, which is a measure of the criticality and reliability of each part of the architecture. The wire routes may be designated as follows: "essential" (M), "sensitive" (S), "non-essential" (1M), and "non-essential sensitive" (1S), with a prefix "1" or "2" to denote side one or two using established nomenclature.

Wire route segregation rules are typically imposed upon avionics architecture design to reduce the probability of failure contamination between differently designated wire routes so that the avionics architecture is robust to any failures within the architecture. As such, avionics architecture design rules may require that dissimilar wire routes are segregated up to and including the physical connectors on the cRDCs 8.

Figure 2:
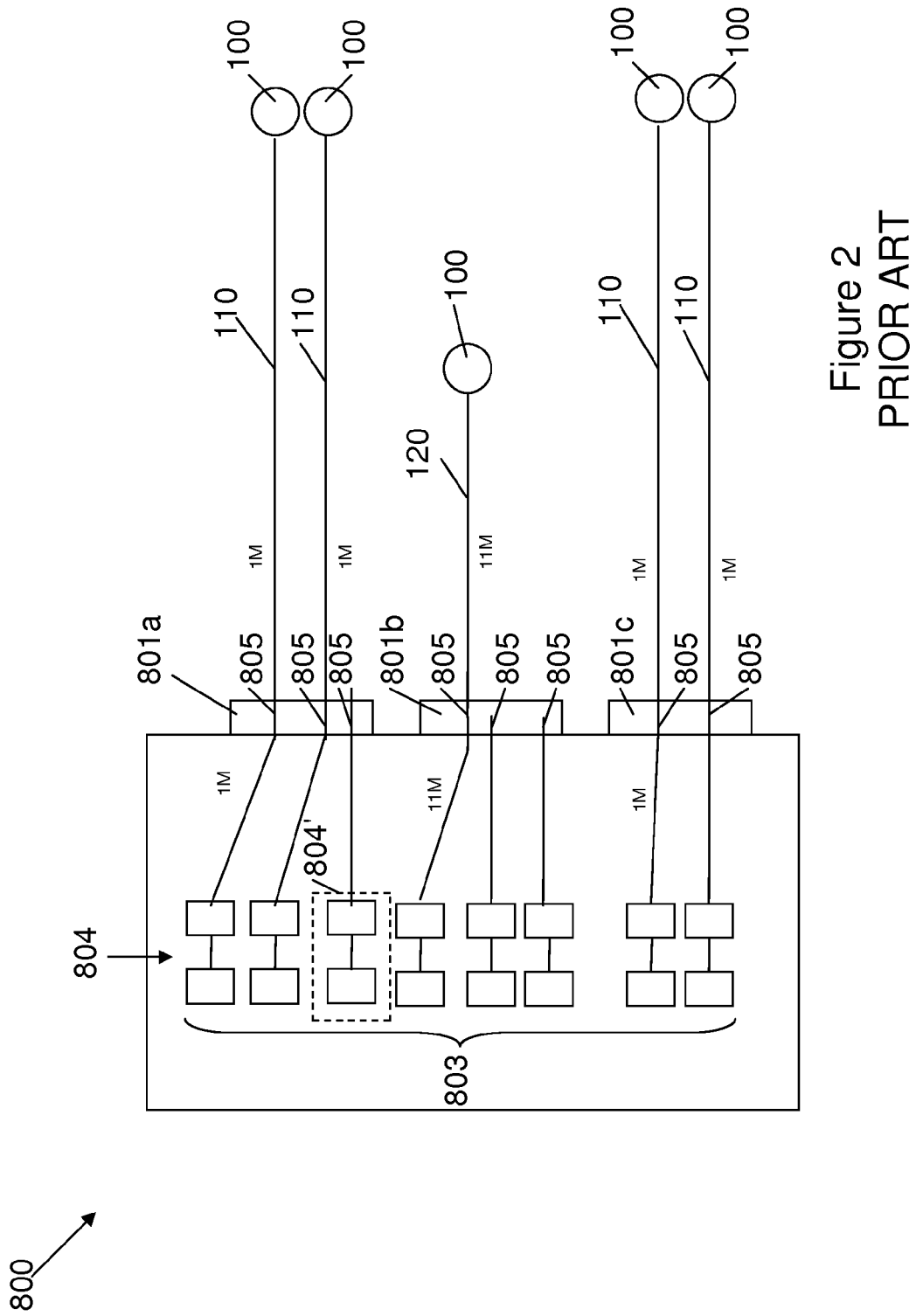
FIG. 2 illustrates schematically a prior art RDC, in which each I/O interface includes hardware electrically connected to a pin of only one connector.

FIG. 2 illustrates a prior art RDC 800, which in this example has three connectors 801a, 801b, 801c. The RDC 800 includes eight input/output (I/O) interfaces 803. Each interface 803 includes interface hardware 804 electrically connected to a single pin 805 of one of the connectors 801a-801c. The connectors 801a and 801b have three pins 805 and the connector 801c has two pins 805 in this example. Two pins 805 of the connector 801 are connected to respective sensor/effectors 100 by 1M designated wire routes 110. Both of the pins 805 of the connector 801c are also connected to respective sensor/effectors 100 by 1M designated wire routes 110. At the location within the avionics architecture of this particular RDC 800 it is also necessary to connect to sensor/effector 100 via 11M designated wire route 120. Whilst the connector 801a has a spare third pin 805, it is not permitted within the wire route segregation rules to connect the 11M designated wire route 120 to the spare pin 805 of connector 801a, since the same connector 801a already has two pins 805 connected to 1M designated wire routes 110. Therefore, the interface hardware 804' indicated within the broken line cannot be used.

Prior to connection of pins 805 of the connector 801b to any designated wire route, any pin of connector 801b can accept any wire route designation. Therefore, the 11M designated wire route 120 may be connected to one of the pins 805 of the connector 801b. Connector 801b then becomes designated as a 11M route and so only wire routes of the same 11M designation can now be connected to the other two remaining pins 805 of connector 801b.

Since the number of wire routes of a particular wire route designation varies significantly around the aircraft, it can be difficult to design a common RDC (cRDC) that can be used at each RDC location without there being a significant number of unused interface hardware within each connected cRDC. Unused interface hardware carries a significant weight penalty for the aircraft as a whole when it is considered that there may be hundreds of unused interface hardware within the RDCs alone for a particular aircraft type.

Figure 3:
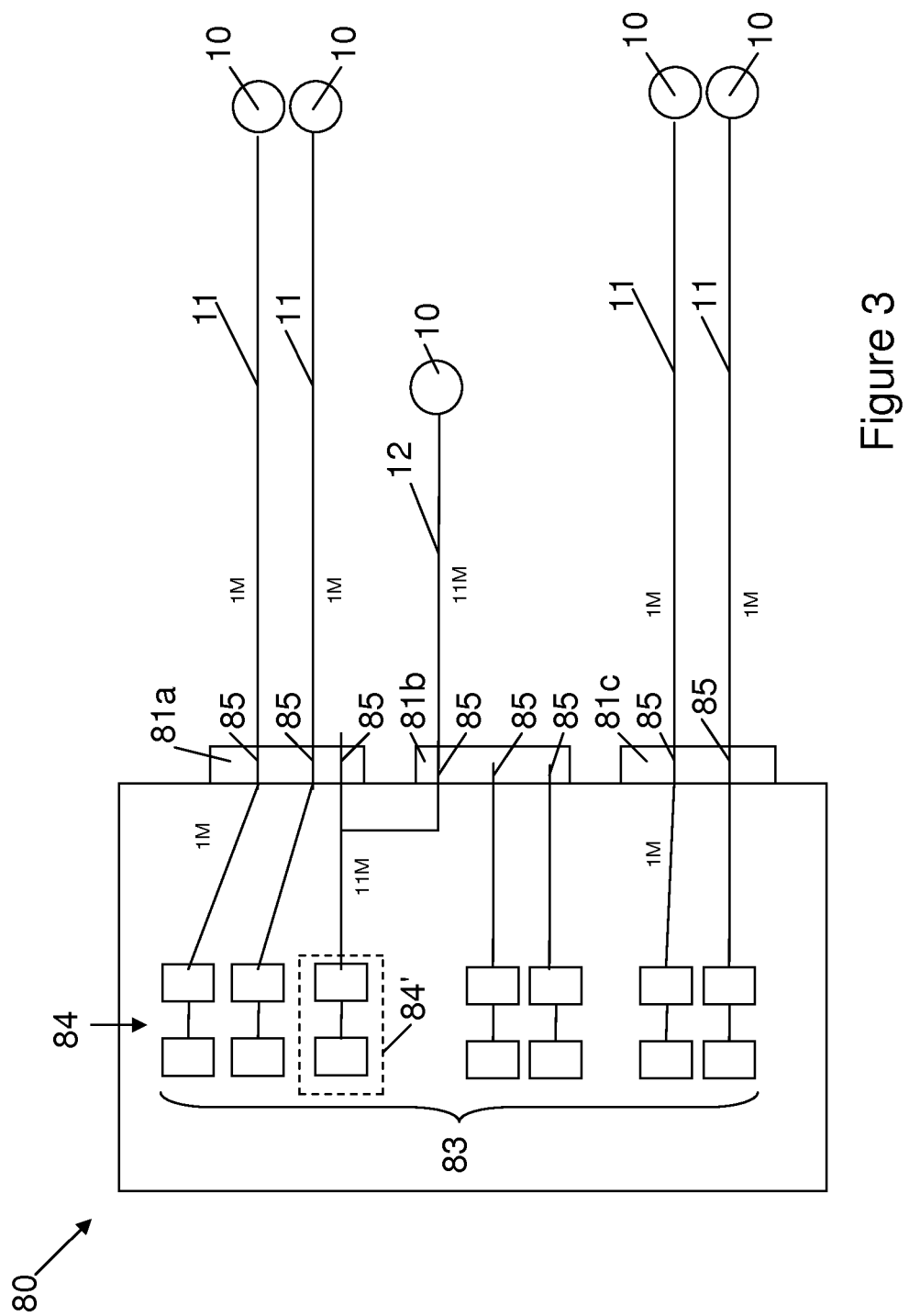
FIG. 3 illustrates schematically an RDC according to a first embodiment, in which one I/O interface includes hardware electrically connected to pins of two different connectors.

An RDC according to a first embodiment of this invention is illustrated schematically in FIG. 3. The RDC 80 shown in FIG. 3 has the same number of connectors 81 and the same number of pins 85 as the RDC 800 described above. However, the number of I/O interfaces 83 has been reduced from eight to seven such that there are only seven sets of hardware 84 within RDC 80. The connections to the pins 85 is the same as that described above with reference to FIG. 2 in that connector 81 has two pins 85 connected to 1M designated wire routes 11, connector 81b has one pin 85 connected to 11M designated wire route, and connector 81c has both pins 85 connected to 1M designated wire routes 11. The wire routes 11, 12 connect to various sensors, effectors, etc. 10.

The only difference between the RDC 80 of FIG. 3 and the RDC 800 of FIG. 2 is that one of the interfaces includes hardware 84' (indicated in broken line) electrically connected to a pin 85 of connector 81a, and is also electrically connected to a pin 85 of connector 81b. Therefore the RDC 80 includes one "multi-interface" meaning that a single interface hardware 84' is electrically connected to one or more pins of each of at least two different connectors 81a, 81b. The benefit of this multi-interface is that the hardware 84' can be selectively used on either a 1M route designation or a 11M route designation, depending on whether the pin 85 of connector 81a or pin 85 of connector 81b is connected. The spare pin 85 of connector 81a cannot be used for 11M designated wire routes since the other two pins 85 of connector 81 are already connected to wire routes of different designation 1M.

As can be seen, the number of interface hardware 84 within RDC 80 has been reduced by the introduction of the multi-interface as compared with prior art RDC 800, without loss of the number of available connections that can be made to the RDC 80. Therefore, the weight of RDC 80 is reduced as compared to RDC 800.

Figure 4:
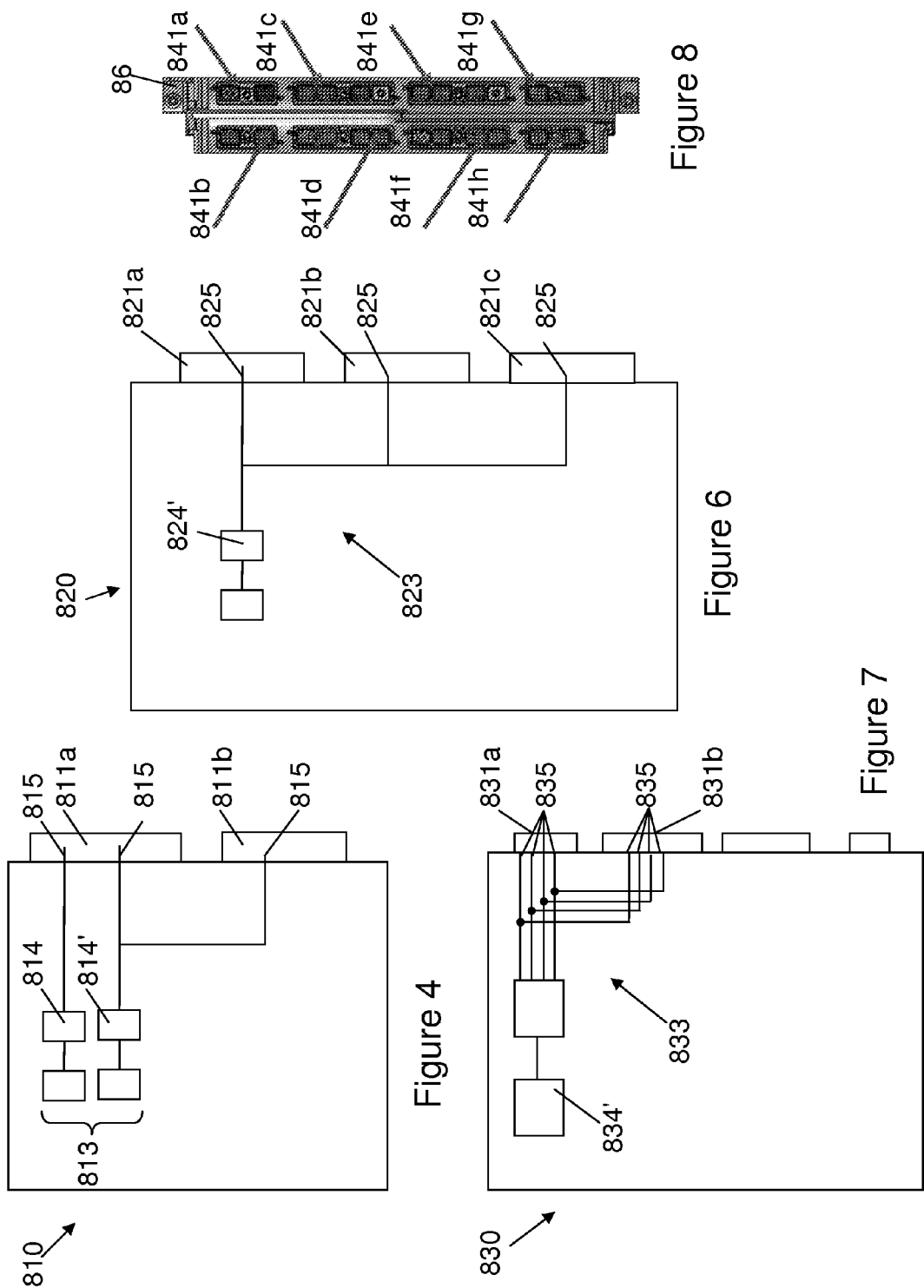
FIG. 4 illustrates schematically a simplified RDC according to a second embodiment having a single I/O interface including hardware connected to a respective pin of two different connectors.

FIG. 4 illustrates schematically a simplified RDC according to a second embodiment. The RDC 810 includes two connectors 811a and 811b. The RDC 810 has two interfaces 813, one of which is a multi-interface. Single interface hardware 814 is electrically connected to a pin 815 of connector 811a. Multi-interface hardware 814' is electrically connected to a pin 815 of connector 811a and also to a pin 815 of connector 811b.

Figure 5:
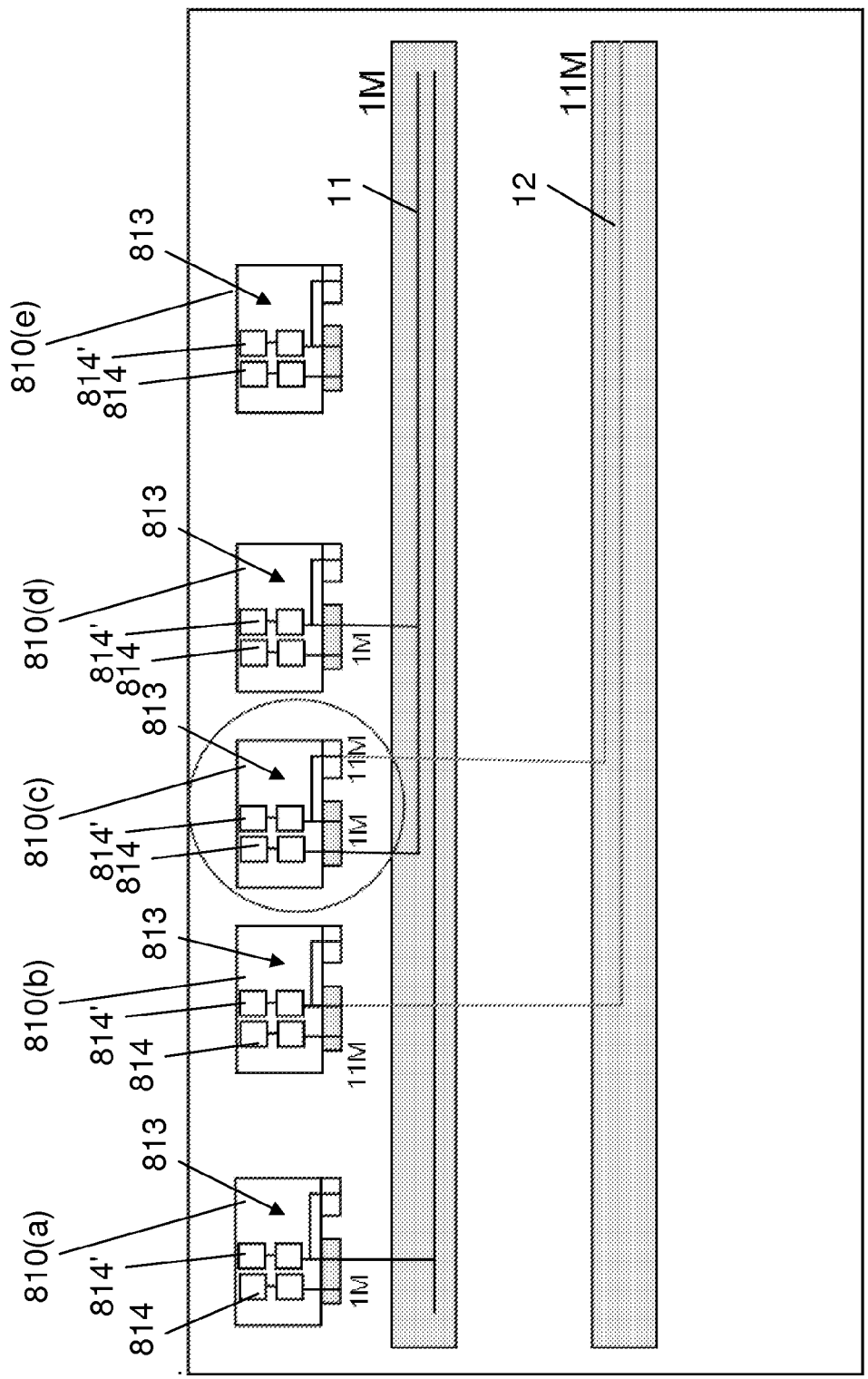
FIG. 5 illustrates schematically part of the avionics architecture having five common RDCs according to second embodiment showing various connection possibilities to two different wire route bundles.

FIG. 5 illustrates how the RDC 810 of the second embodiment can be used as a common RDC (cRDC) within an avionics architecture. Each cRDC 810 has identical hardware. The five cRDCs 810 are labelled (a)-(e) in FIG. 5. The two connectors 811a and 811b shown in FIG. 4 will be referred to as "first" and "second" connectors, respectively, in the following.

cRDC 810(a) has its first connector connected to 1M designated wire route bundle 11. Since it is not possible to connect more than one pin of a multi-interface at any instance, the second connector of cRDC 810(a) is unconnected. cRDC 810(b) has its first connector connected to 11M designated wire route bundle 12, and again the second connector is unconnected. Comparing cRDCs 810(a) and 810(b) shows how the first connector may be selectively used for connection to either the 1M route designation or the 11M route designation, depending on the location of the cRDC within the architecture. Although the single interface (which also uses the first connector) is shown unconnected on cRDCs 810(a) and 810(b), it will be appreciated that this single interface could be connected to a wire route of the same designation (1M or 11M, respectively) as the multi-interface which is already using the first connector.

cRDC 810(c) has been circled in FIG. 8 as this is the only one of the five cRDCs 810 shown which makes use of the second connector. As can be seen, the first connector has a route designation 1M, since the pin of the single interface is connected to the wire route bundle 11 having route designation 1M. Therefore, the multi-interface hardware 814' cannot be connected to the wire route bundle 12 having route designation 11M using the first connector. Instead, the multi-interface hardware 814' is connected via the pin of the second connector to the wire route bundle 12 having route designation 11M.

cRDC 810(d) has an identical connection arrangement to cRDC 810(a), and cRDC 810(e) is unconnected to either wire route 1M or wire route 11M (but of course may be connected to other wire route designations). As can be seen, even a highly simplified example of the cRDC having the multi-interface is very flexible in terms of the connections that can be made to wire routes of different route designations.

FIG. 6 illustrates an RDC according to a fourth embodiment. The RDC 820 has three connectors 821a, 821b and 821c, and a single I/O interface 823. The interface 823 includes multi-interface hardware 824' electrically connected to a pin 825 of each of the three connectors 821a-821c. Comparing the RDC 820 of FIG. 5 with the RDC 810 of FIG. 4, it can be seen that the multi-interface of this invention is not limited to making connections to only two connectors but can be adapted for connection to three (or more) connectors. Increasing the number of pins on different connectors that the same interface hardware is connected to potentially increases the number of different wire route designations that can access the interface hardware, thus further increasing the flexibility of the cRDC design. However, the number of spare pins also decreases and so there is a corresponding trade off with space requirements.

FIG. 7 illustrates an RDC according to a fourth embodiment. The RDC 830 includes a multi-pin multi-interface 833. Multi-pin interfaces include hardware electrically connected to multiple pins of the same connector. The arrangement shown in FIG. 7 illustrates how a multi-pin interface can be connected to respective pins of a plurality of different connectors so as to provide a multi-pin multi-interface. As shown in FIG. 7, the multi-pin multi-interface 833 includes interface hardware 834' electrically connected to each of four pins 835 of connector 831a and is also connected to a corresponding set of four pins 835 of connector 831b. In this way, the connectors 831a and 831b can have a different route designation and connections can be made to the multi-pin multi-interface 833 from wiring routes of different route designations selectively.

FIG. 8 illustrates a connector face 86 of an exemplary RDC having eight connectors labelled 841a-841h. As can be seen, each of the connectors 841a-841h has a pin arrangement designed to provide the required number of pin connections for various wire route designations such that a common RDC having the connector face 86 may be used throughout an aircraft. The pin arrangements of each of the eight connectors 841a-841h may be different.

Although in the examples described above, RDCs have been used to show how the multi-interface of this invention can be applied in LRUs, it will be appreciated that the invention can also be applied to other LRUs, such as avionics bay units, for example. The benefit of using multi-interfaces within RDCs is of particular benefit as there are potentially a large number of identical units within an aircraft.

Although the invention has been described above with reference to one or more preferred embodiments, it will be appreciated that various changes or modifications may be made without departing from the scope of the invention as defined in the appended claims.

The invention claimed is:

1. A line replaceable unit (LRU) for an integrated modular avionics architecture, the LRU comprising at least one input/output interface and a plurality of connectors disposed within the LRU, wherein each connector includes at least one pin and said at least one pin of each connector is either unused or is connected to a single wire route bundle segregated from dissimilar wire route bundles according to segregation rules, and any other pins of each said connector that has a connected pin are precluded from connection to a wire route bundle dissimilar to said wire route bundle of the connected pin, and wherein hardware of one input/output interface is electrically connected within the LRU to one or more pins of each of at least two of the connectors.

2. A LRU according to claim 1, wherein each pin is electrically connected to no more than hardware of the one input/output interface within the LRU.

3. A LRU according to claim 1, wherein at least some of the connectors include a plurality of pins.

4. A LRU according to claim 3, wherein hardware of the one input/output interface is electrically connected to a plurality of pins of one connector.

5. A LRU according to claim 4, wherein hardware of the one input/output interface is electrically connected to a plurality of pins of each of at least two of the connectors.

6. A LRU according to claim 1, comprising a plurality of input/output interfaces, each electrically connected to at least one pin.

7. A LRU according to claim 1, which is a remote data concentrator (RDC) or an avionics bay unit.

8. An integrated modular avionics (IMA) architecture including at least one LRU according to claim 1.

9. An IMA architecture according to claim 8, wherein individual connectors of the or each LRU are connected to no more than one segregated wire route bundle, and the wire route segregation is maintained up to and including the connectors.

10. An IMA architecture according to claim 8, wherein at least one LRU has a plurality of connectors each connected to the same wire route bundle.

11. An IMA architecture according to claim 8, including a plurality of the LRUs each having identical hardware.

12. An IMA architecture according to claim 11, wherein corresponding connectors of two of the LRUs are either connected to dissimilar segregated wire route bundles, or only one of the connectors is connected to a wire route bundle.

13. An IMA architecture according to claim 8, wherein each wire route is designated according to a side of an aircraft and/or an essentiality selected from the group consisting of: essential, sensitive, non-essential, and non-essential sensitive.

14. An aircraft including the LRU of claim 1.

15. An aircraft including the IMA architecture according to claim 8.

* * * * *